United States Patent [19]

Kishi

[11] Patent Number: 5,437,777

[45] Date of Patent: Aug. 1, 1995

[54] APPARATUS FOR FORMING A METAL WIRING PATTERN OF SEMICONDUCTOR DEVICES

[75] Inventor: Shuji Kishi, Tokyo, Japan

[73] Assignee: NEC Corporation, Tokyo, Japan

[21] Appl. No.: 997,181

[22] Filed: Dec. 28, 1992

[30] Foreign Application Priority Data

Dec. 26, 1991 [JP] Japan .................... 3-358885

[51] Int. Cl.$^6$ ............................................. C25D 17/00
[52] U.S. Cl. ................................................. 204/224 R
[58] Field of Search ................................... 204/224 R

[56] References Cited

FOREIGN PATENT DOCUMENTS 190134 8/1991 Japan .

Primary Examiner—T. M. Tufariello
Attorney, Agent, or Firm—Sughrue, Mion, Zinn, Macpeak & Seas

[57] ABSTRACT

A plating apparatus for forming a wiring pattern on a surface of a semiconductor wafer by causing a plating liquid into contact with the surface of the semiconductor wafer, comprises a storage tank storing and heating a plating liquid, a plating tank provided adjacent to the storage tank and having an opening formed in a wall at the side opposite to the side adjacent to the storage tank. The plating tank is supplied with the plating liquid from the storage tank, and the opening is configured to bring the surface of the semiconductor wafer into contact with the treatment liquid within the treatment tank. A holding mechanism is provided for holding the semiconductor wafer vertically and pushing the surface of the semiconductor wafer to the opening. With this arrangement, it is possible to prevent the unevenness of the plating which would otherwise have been caused by the bubbles generated in the process of the plating.

4 Claims, 4 Drawing Sheets

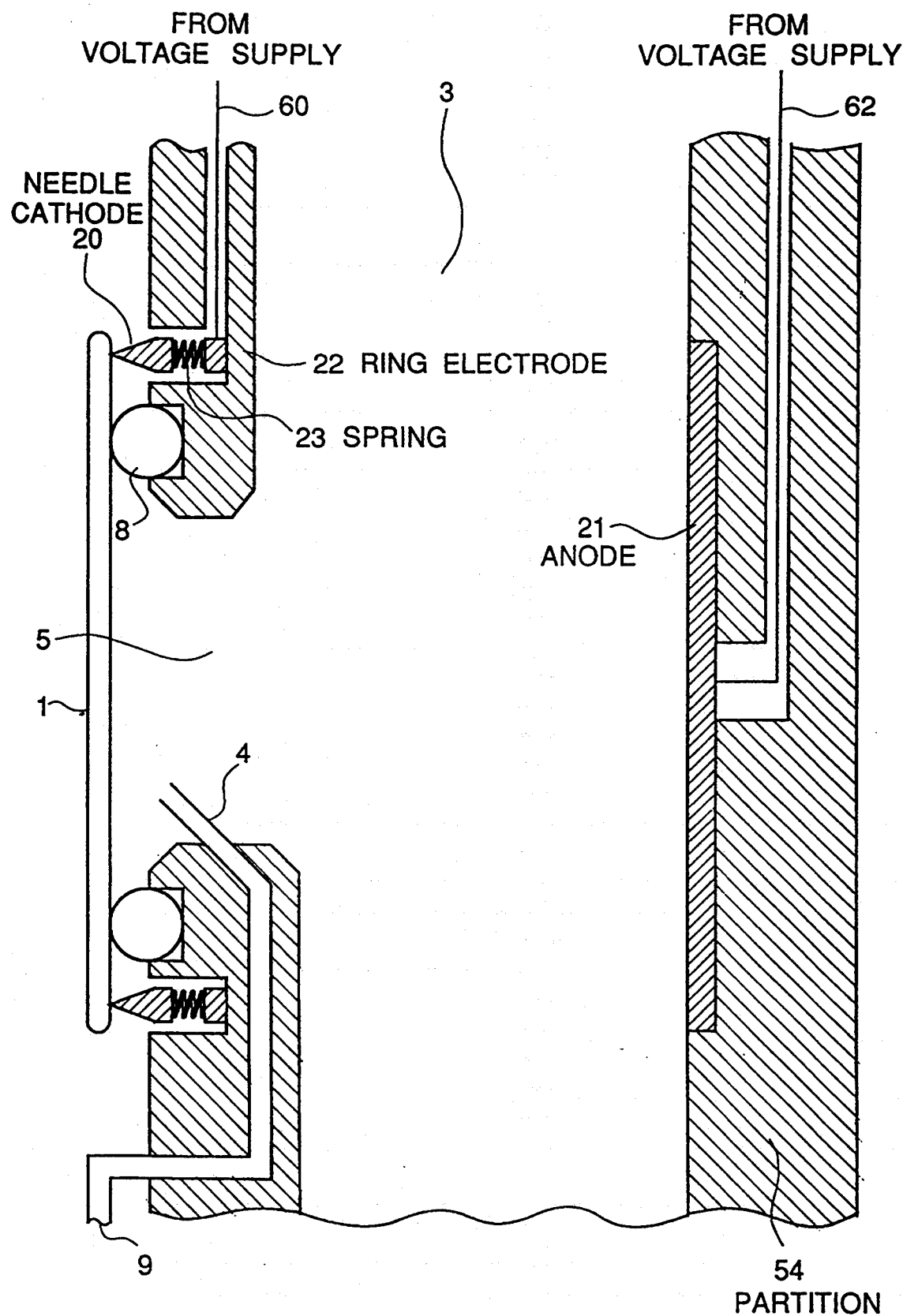

APPARATUS FOR FORMING A METAL WIRING PATTERN OF SEMICONDUCTOR DEVICES

BACKGROUND OF THE INVENTION

1. Field of the invention

The present invention relates to a semiconductor device manufacturing apparatus, and more specifically an electroless plating or electroplating apparatus used in the process of manufacturing semiconductor devices.

2. Description of Related Art

In recent VLSIs (very large scale integrated circuits), a study has been made of using a noble metal as a wiring material from a viewpoint of reliability and performance. In particular, attention has been focused on gold (Au) as the wiring material, since Au has a low specific resistance and is extremely chemically stable.

Generally, in the case of forming an Au wiring conductor, a method of using a photolithography and a gold plating technique in combination for forming a desired wiring pattern has been widely used.

The gold plating technique can be divided into an electroplating and an electroless plating, and also can be divided into a so-called "dipping method" in which a whole of a semiconductor wafer (substrate) is dipped into a treating tank, and a so-called "face-down method" in which a semiconductor wafer is faced down so that only a faced-down surface of the semiconductor wafer is brought into contact with a treating liquid. However, the dipping method is disadvantageous in which soils and dusts on a rear surface of the semiconductor wafer contaminates the plating liquid, with the result that quality of a plated film is deteriorated, and Au is deposited on the rear surface of the semiconductor wafer to some extent. This is a cause of so called "particles". Therefore, in the LSIs in which an extremely fine pattern has to be realized, the face-down method has been used for a mass production.

Referring to FIG. 1, there is illustrated an example of a conventional face-down method, A plating tank 30 is located upwardly and has a cathode 31 provided along an upper directed opening thereof. The plating tank also includes a mesh anode 32 located at a meddle level thereof positioned to oppose the opening of the plating tank. A semiconductor wafer 1 is supported at its periphery by the cathode 31 in such a manner that a front surface of the semiconductor wafer 1 to be treated is faced down so as to oppose the mesh anode 32 located at the middle level of the plating tank 30. With this arrangement, a DC or pulsed current is applied from a power supply 33 between the cathode 31 and the anode 32, while a plating liquid 34 is continuously introduced from a bottom of the plating tank 34 in a direction of an arrow D toward the front surface of the semiconductor wafer 1 so that the plating liquid 34 overflows from the upper edge of the plating tank 30 in directions of arrows B and C.

In the above mentioned plating apparatus, a maximum problem is a countermeasure for bubbles. An optimum operation temperature of commercially available gold plating liquid is ordinarily 60° C. to 75° C., and a good film quality can be obtained at about 70° C. At this temperature, air dissolved in the plating liquid gasifies into the form of extremely small bubbles and adheres on a wall of a piping conduit and the tank, and when the bubbles grow to a some degree of size, the bubbles depart from the wall so as to move together with the plating liquid. As illustrated in FIG. 2, if the bubble(s) reaches the front surface of the semiconductor wafer together with the plating liquid, the bubble 36 adheres a stepped or concave portion of a patterned photoresist film 35 deposited on the semiconductor wafer, with the result that an uneven plated film is formed.

In order to overcome this unevenness of the plated film, there having been proposed various methods, which include a method of greatly increasing the flow rate of the plating liquid so that the bubble 36 is blown out by the forced plating liquid flow, another method for moving up and down the liquid surface of the plating liquid, and a third method of forming a plurality of holes for injecting the plating liquid into the plating tank so as to ceaselessly change the hole of injecting the plating liquid 34, so that the position of of injecting the plating liquid 34 is changed. However, any of the proposed methods is not satisfactory, since the bubble 36 is difficult to be removed because all the proposed methods are basically of the face-down method.

Specifically, in the method of blowing out the bubble 36 by the forced plating liquid flow, the plating liquid 34 becomes easy to scatter from the upper opening of the plating tank 30, and therefore, the circumstance of the plating tank becomes dirty, and splashes of the plating liquid 34 is deposited on the rear surface of the semiconductor wafer. Namely, the splashes of the plating liquid 34 become a cause of the soil 0f the rear surface of the semiconductor wafer.

In addition, the method of moving up and down the liquid surface is disadvantageous in that when the liquid surface is lowered, the wafer surface is dried, and therefore, deposition occurs, which becomes a cause for the uneven plating and the soil.

The method of changing the position of of injecting the plating liquid 34 has various defects. For example, the structure of the apparatus becomes complicated.

Under the above mentioned circumstance, at present, it has been the most practical bast way to maintain the temperature of the plating liquid 34 not greater than 60° C. so as to suppress the generation of the bubbles 36. However, if the temperature of the plating liquid 34 is lowered to a temperature not greater than 60° C., unevenness occurs in the quality of the plated film, with the result that the lift of the obtained wiring conductors becomes unstable, and an appearance of the surface also becomes unstable.

On the other hand, the bubbles are generated by another reason, which becomes a fatal defect particularly in the case of the electroless plating. The plating is a reduction reaction, regardless of whether it is the electroplating or the electroless plating. Therefore, a gas of $H_2$ is generated in the course of the reaction. In particular, this gas is generated at the wafer surface, and therefore, even if the temperature of the plating liquid 34 is lowered, the generation of the bubbles cannot be completely suppressed. In the electroless plating, since a time required for obtaining the same plate film thickness is several times to several tens times that required in the electroplating, the influence of the $H_2$ gas is remarkable.

SUMMARY OF THE INVENTION

Accordingly, it is an object of the present invention to provide a plating apparatus used in the process of manufacturing semiconductor devices, which has overcome the above mentioned defect of the conventional one.

Another object of the present invention is to provide a plating apparatus used in the process of manufacturing semiconductor devices, which can prevent the unevenness in the plating caused by the bubbles generated in the plating process.

The above and other objects of the present invention are achieved in accordance with the present invention by a plating apparatus for forming a wiring pattern on a surface of a semiconductor wafer by causing a plating liquid into contact with the surface of the semiconductor wafer, the plating apparatus comprising a storage tank storing and heating a treatment liquid, a treatment tank provided adjacent to the storage tank and having an opening formed in a wall at the side opposite to the side adjacent to the storage tank, the treatment tank being supplied with the treatment liquid from the storage tank, the opening being configured to bring the surface of the semiconductor wafer into contact with the treatment liquid within the treatment tank, and a holding mechanism for holding the semiconductor wafer vertically and pushing the surface of the semiconductor wafer to the opening.

In a preferred embodiment, the plating apparatus further includes a gas blowing mechanism provided in the treatment tank for blowing a gas into the treatment liquid within the treatment tank, toward the surface of the semiconductor wafer which is held by the holding mechanism to be pushed to the opening.

In the case of the electroplating type, the plating apparatus further includes a plurality of needle electrodes provided at a periphery of the opening and configured to be brought into contact with the surface of the semiconductor wafer which is held by the holding mechanism to be pushed to the opening, and a plate electrode located on an inner wall at a position opposing to the opening.

The above and other objects, features and advantages of the present invention will be apparent from the following description of preferred embodiments of the invention with reference to the accompanying drawings.

BRIEF DESCRIPTION OF THE DRAWINGS

FIG. 5 is a partial enlarged diagrammatic sectional view of a second embodiment of the plating apparatus in accordance with the present invention.

DESCRIPTION OF THE PREFERRED EMBODIMENTS

Figure 1:
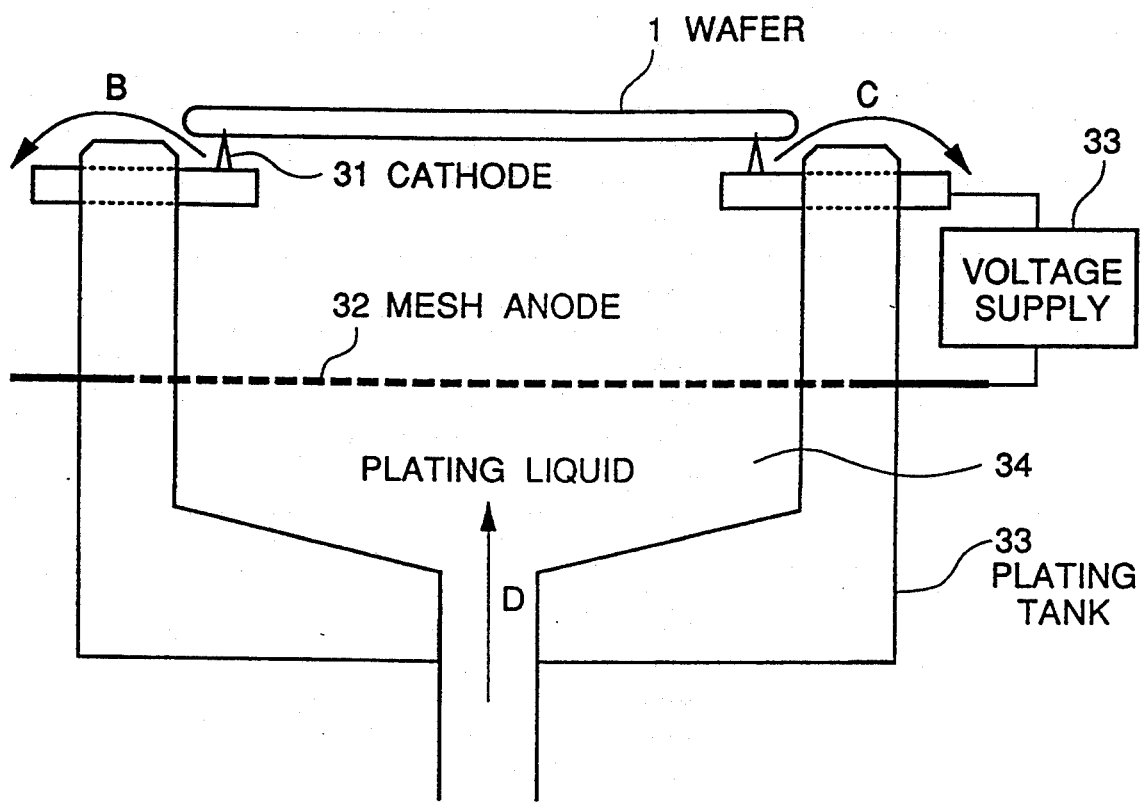
FIG. 1 is a diagrammatic sectional view of the conventional down-face type plating apparatus.
Figure 2:
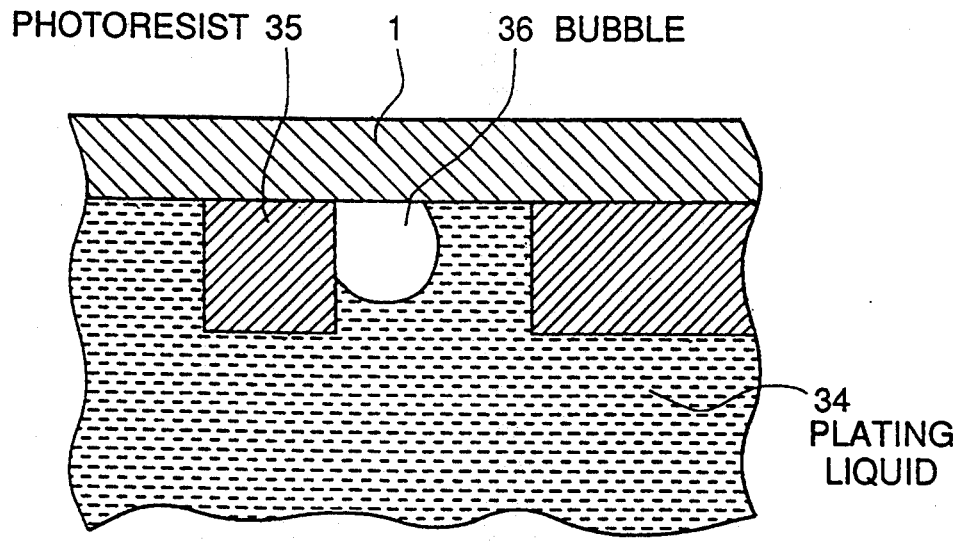
FIG. 2 is an enlarged diagrammatic sectional view illustrating the bubble deposited on the front surface of the semiconductor wafer.
Figure 3:
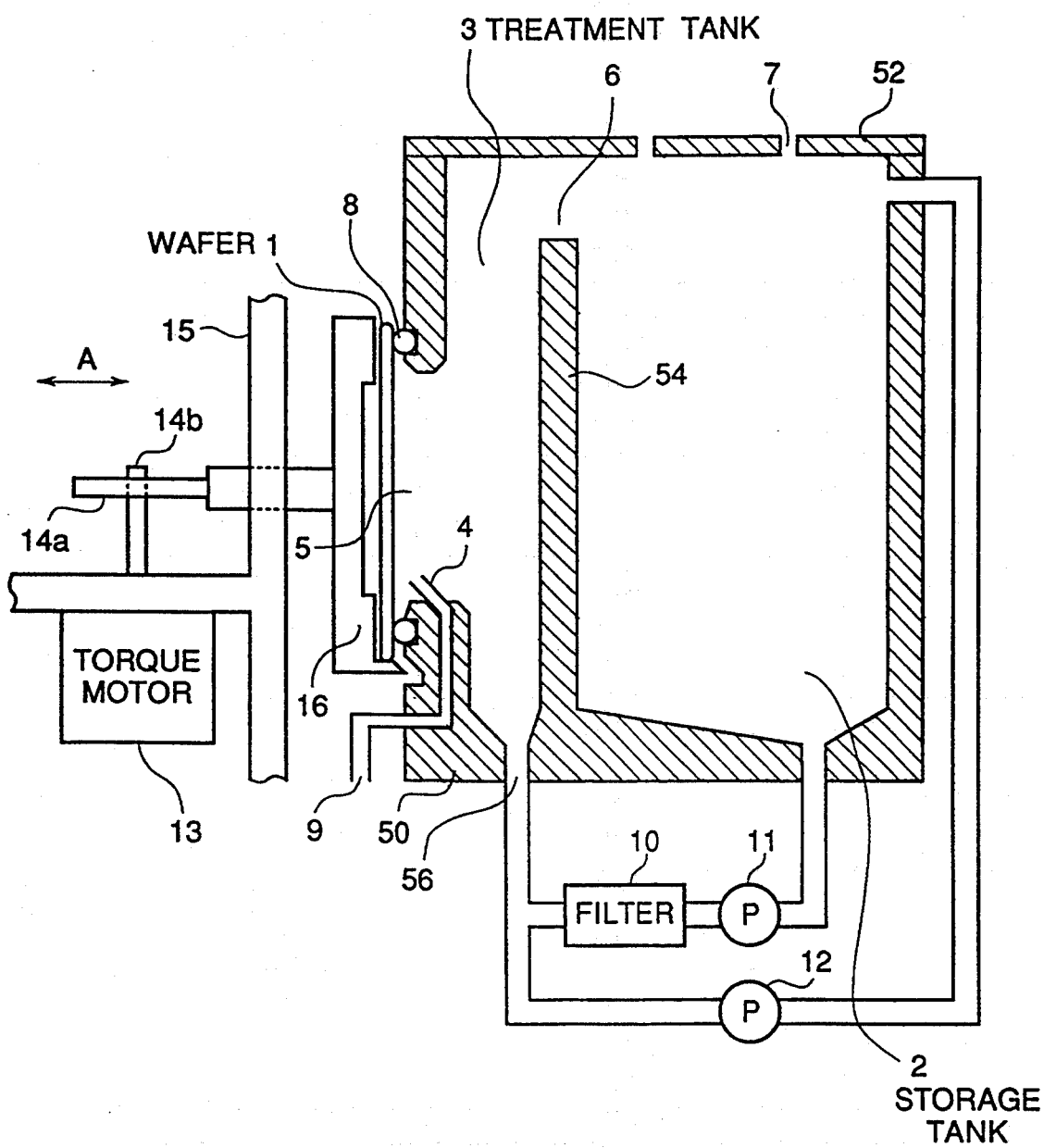
FIG. 3 is a diagrammatic sectional view of a first embodiment of the plating apparatus in accordance with the present invention.
Figure 4:
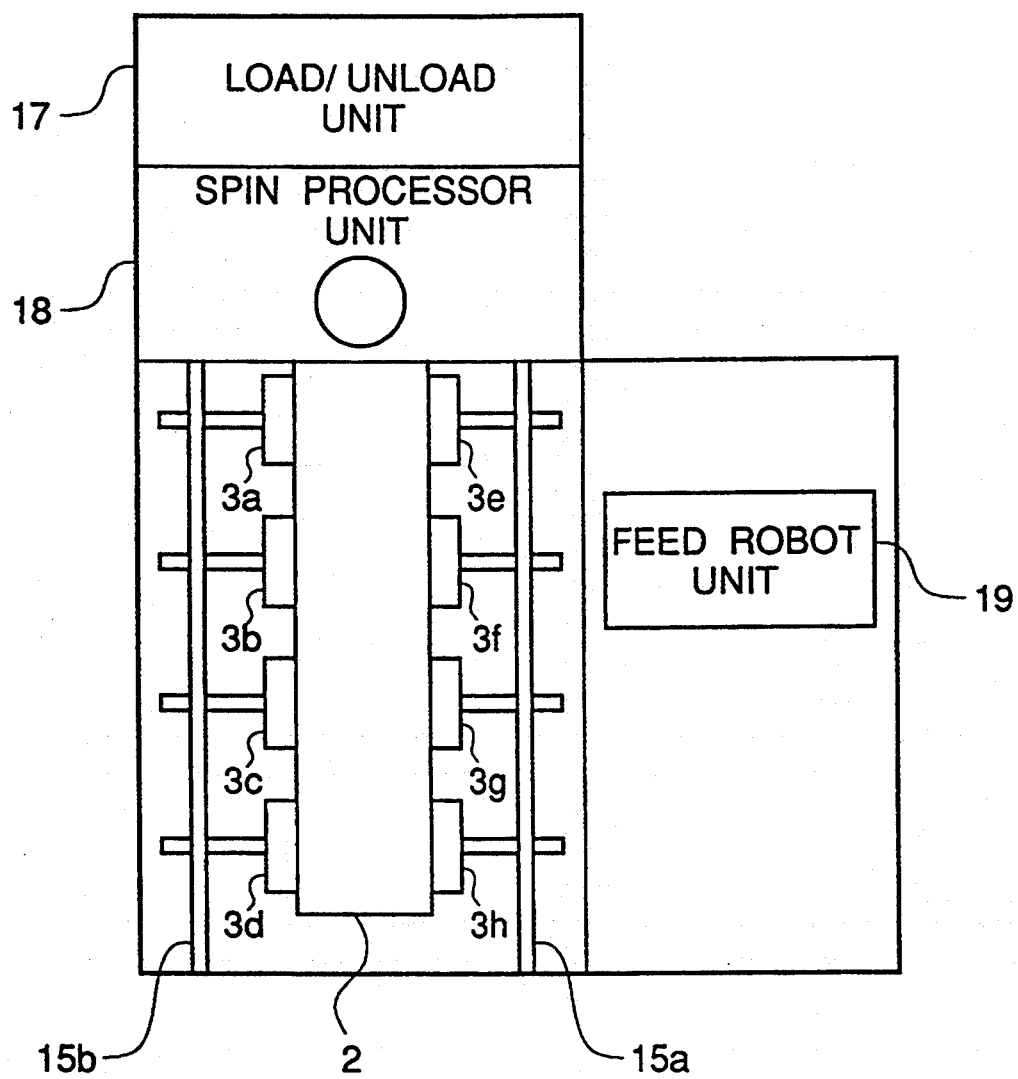
FIG. 4 is a diagrammatic plan view of a plating system including the first embodiment of the plating apparatus in accordance with the present invention.

Referring to FIG. 3, there is shown a diagrammatic sectional view of a first embodiment of the plating apparatus in accordance with the present invention. In addition, FIG. 4 is a diagrammatic plan view of a plating system including the first embodiment of the plating apparatus in accordance with the present invention. The shown first embodiment is an electroless Au-plating apparatus.

As shown in FIG. 4, the shown electroless Au-plating system includes an unload/load unit 17 for loading and unloading semiconductor wafers 1, a spin processor unit 18 for water-washing and drying the semiconductor wafers 1, a feed robot unit 19 for inverting and feeding the semiconductor wafers 1, and a plurality of treatment tanks 3a to 3h. These treatment tanks 3a to 3h have the same structure, and therefore, will be explained with reference to a treatment tank 3 shown in FIG. 3.

The treatment tank 3 is separated from a common plating liquid storage tank 54 by a partition 54. The eight treatment tanks 3 and the common storage tank 2 are defined in one vessel 50 hermetically covered with a top cover plate 52. The treatment tank 3 has a side opening 5. A semiconductor wafer 1 is supported by a vertically supporting head 16, which is slidably supported by a vertical wall 15 and which is configured to be moved in a horizontal direction shown by a arrow A, by means of a torque motor 13 and a gear assembly including a pair of gears 14a and 14b, so that the semiconductor wafer 1 supported by a vertically supporting head 16 is forcibly brought into contact with an O ring 8 provided in the opening 5 of the treatment tank 3.

A plating liquid, which is stored in the storage tank 2 and which is heated to a predetermined constant temperature by a not-shown means, is fed by a pump 11 so as to pass through a filter 10 and to be supplied from a bottom hole 56 into the treatment tank 3, so that the plating liquid is returned to the storage tank 2 through an overflow opening 6 defined in an upper end of the partition 54. In this condition, since the semiconductor wafer 1 is forcibly brought into contact with the O ring 8, the plating liquid is hermetically sealed at the opening 5 of the tank 3.

In addition, a nitrogen/oxygen mixed gas or an inert gas is introduced into the treatment tank 3 from a gas introducing part 9 through a nozzle 4 directed toward the semiconductor wafer, so that the surface of the semiconductor wafer is subjected to a bubbling. With this arrangement, bubbles generated in the course of the plating are conveyed together with the bubbles injected from the nozzle 4, toward an upper portion of the treatment tank 3, so that all gas is exhausted through venting holes 7 formed the top cover plate 52. In addition, the bottom hole 56 is also connected to an inlet of another pump 12 having an outlet connected to an upper portion of the storage tank 2, so that after the plating treatment has been completed, the plating liquid within the treatment tank 3 is returned to the storage tank by the pump 12. Thereafter, the wafer 1 can be separated from the O ring 8 and then removed from the holding head 16.

As mentioned above, since the storage tank and the treatment tank 3 are adjacent to each other, the treatment tank 3 itself is heated, and therefore, a difference in temperature between the plating liquid within the storage tank 2 and the plating liquid within the treatment tank 3 can be made small and stable.

Incidentally, it is a matter of course that the storage tank 2 is provided with a heater, a temperature sensor and a liquid surface sensor, which are however omitted in the drawing for simplification of the drawings. In addition, electromagnetic valves, a flow meter, a gas filter, etc. are actually provided, but they are also omitted in the drawings since they do not have a direct relation to the gist of the invention.

Furthermore, the apparatus is controlled by a microcomputer (not shown) so that a plating condition (mainly a plating time) can be set for each of the semiconductor wafers 1. Therefore, the apparatus is suitable to a batch treatment of small-amount many-kind products.

In the embodiment, the treatment tank 3, the storage tank 2 and pipings (not shown) are preferably formed of polypropylene and have an inner smooth surface, in order to prevent a self-deposition of Au. In a temperature region in which influence of a thermal expansion does not appear, it is more preferable to use Teflon.

Referring to FIG. 5, there is shown a partial enlarged diagrammatic sectional view of a second embodiment of the plating apparatus in accordance with the present invention. The second embodiment is of the electroplating type.

The second embodiment is substantially the same as the first embodiment shown in FIGS. 3 and 4, except that plating electrodes and a voltage supply are added in the second embodiment.

A cathode 20 is formed of a number of needle electrodes incorporating therein a spring mechanism. Namely, the needle cathodes 20 are connected through a spring 23 to a common ring electrode 22, which is embedded in the wall of the vessel 50 at an outside of the O ring 8. The ring electrode 22 is connected at its one portion through a wiring conductor 60 to a voltage supply (not shown), so that a voltage is supplied to all the needle cathodes 20. Ordinarily, it is sufficient if the number of the needle cathodes 20 is 6. An anode 21 is formed of a plate electrode which is analog to the semiconductor wafer 1 in shape and which is the substantially the same size as that of the semiconductor wafer 1. The anode 21 is located on the partition 54 at a position opposing to the opening 5, and is connected to the voltage supply (not shown) through a wiring conductor 62.

In the case of the electroplating, the narrower the space between the cathodes 20 and the anode 21 becomes, the better the plated film thickness distribution becomes. The space between the cathodes 20 and the anode 21 is preferably 3 cm to 5 cm. Since the anode 21 is formed of the plate electrode, the evenness is greatly improved in comparison with the conventional mesh electrode. This is because the flow of the plating liquid is made perpendicular to the direction of the electric current.

As mentioned above, according to the present invention, the method of plating the semiconductor wafer 1 is modified from the conventional face-down method to a vertical method combined with the bubbling mechanism. With this arrangement, it is possible to prevent the unevenness of the plating which would otherwise have been caused by the bubbles generated in the process of the plating, with the result that a plating film having an extremely good quality can be obtained.

In addition, since the anode 21 is formed of the plate electrode, a good plated film having an even film thickness can be obtained in the electroplating apparatus.

The invention has thus been shown and described with reference to the specific embodiments. However, it should be noted that the present invention is in no way limited to the details of the illustrated structures but changes and modifications may be made within the scope of the appended claims.

I claim:

1. A plating apparatus for forming a wiring pattern on a surface of a semiconductor wafer by causing a plating liquid into contact with the surface of the semiconductor wafer, the plating apparatus comprising a storage tank storing and heating a treatment liquid, a treatment tank provided adjacent to said storage tank and having an opening formed in a wall at the side opposite to the side adjacent to said storage tank, said treatment tank being supplied with said treatment liquid from said storage tank, said opening being configured to bring the surface of the semiconductor wafer into contact with said treatment liquid within said treatment tank, and a holding mechanism for holding said semiconductor wafer vertically and pushing said surface of said semiconductor wafer to said opening.

2. A plating apparatus claimed in claim 1 further including a gas blowing mechanism provided in said treatment tank for blowing a gas into said treatment liquid within said treatment tank toward said surface of said semiconductor wafer which is held by said holding mechanism to be pushed to said opening.

3. A plating apparatus claimed in claim 2 further including a plurality of needle electrodes provided at a periphery of said opening and configured to be brought into contact with said surface of said semiconductor wafer which is held by said holding mechanism to be pushed to said opening, and a plate electrode located on an inner wall at a position opposing to said opening.

4. A plating apparatus claimed in claim 1 further including a plurality of needle electrodes provided at a periphery of said opening and configured to be brought into contact with said surface of said semiconductor wafer which is held by said holding mechanism to be pushed to said opening, and a plate electrode located on an inner wall at a position opposing to said opening.

* * * * *